United States Patent
Bukethal et al.

(10) Patent No.: US 10,110,230 B2
(45) Date of Patent: Oct. 23, 2018

(54) LEVEL SHIFTER AND METHOD FOR OPERATING THE SAME

(71) Applicant: Infineon Technologies AG, Neubiberg (DE)

(72) Inventors: Christoph Bukethal, Dresden (DE); Mayk Roehrich, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/677,046

(22) Filed: Aug. 15, 2017

(65) Prior Publication Data
US 2018/0062657 A1  Mar. 1, 2018

(30) Foreign Application Priority Data

Aug. 23, 2016 (DE) .................. 10 2016 115 600

(51) Int. Cl.
*H03K 19/0175* (2006.01)
*H03K 19/094* (2006.01)
*H03K 19/0185* (2006.01)

(52) U.S. Cl.
CPC ............... *H03K 19/018521* (2013.01)

(58) Field of Classification Search
CPC ........................... H03K 19/018521
USPC ........................................... 326/81
See application file for complete search history.

(56) References Cited

U.S. PATENT DOCUMENTS

| | | | |
|---|---|---|---|
| 5,764,097 A | 6/1998 | Whitfield | |
| 6,333,662 B1 | 12/2001 | Umezawa et al. | |
| 7,348,800 B2 | 3/2008 | Koto et al. | |
| 7,560,970 B2 | 7/2009 | Cook et al. | |
| 8,406,068 B2 * | 3/2013 | Castaldo | ........ H03K 19/018528 365/189.11 |
| 2009/0058493 A1 | 3/2009 | Arnold et al. | |
| 2011/0095804 A1* | 4/2011 | Kumar | ........... H03K 19/018521 327/333 |
| 2014/0240208 A1 | 8/2014 | Kim et al. | |
| 2016/0294373 A1* | 10/2016 | Grubelich | ........ H03K 3/356104 |

FOREIGN PATENT DOCUMENTS

DE          69517287 T2     10/2000
DE       102014102151 A1    8/2014

* cited by examiner

*Primary Examiner* — Daniel D Chang
(74) *Attorney, Agent, or Firm* — Viering, Jentschura & Partner mbB

(57) ABSTRACT

In various embodiments, a level shifter and a method for operating the same are provided. The level shifter may include a low supply voltage terminal, a high supply voltage terminal, at least one input terminal, at least one output terminal, and a latch. The latch may configured to: store a predetermined logic state by setting a storage node to a voltage level in response to receiving a predetermined voltage level at the at least one input terminal; amend the voltage level at the storage node in response to receiving an amended voltage/s at the low supply voltage terminal and/or at the high supply voltage terminal; and output the predetermined logic state having the amended voltage level from the storage node to the at least one output.

20 Claims, 3 Drawing Sheets

PRIOR ART

LEVEL SHIFTER AND METHOD FOR OPERATING THE SAME

CROSS-REFERENCE TO RELATED APPLICATIONS

This application claims priority to German Patent Application Serial No. 10 2016 115 600.0, which was filed Aug. 23, 2016, and is incorporated herein by reference in its entirety.

BACKGROUND

The present invention relates generally to a level shifter and a method for operating the same.

Logic device supply voltages are commonly approx. 1 V, that is a low voltage level. However, higher voltage levels are required for operating non-volatile flash memories, e.g. 10 to 17 V. Special high voltage (HV) devices are used in the logic process to handle these high voltages.

In general, a low voltage has a voltage level that is above 0 V. Further, a medium voltage has a voltage level that is above the voltage level of the low voltage, and a high voltage has a voltage level that is above the voltage level of the medium voltage. Specific transition values between the voltage levels of the low voltage, medium voltage and high voltage depend on the specific application of the logic device and are known in the arts.

To switch high output voltage signals 306, 308 by lower input voltage signals 310, 312 a so called level shifter is used. A known design of a level shifter uses a cascode structure using cascode terminal 314, 316—illustrated in FIG. 3—if the output high voltage is higher than the maximum allowed device operating voltage. The cascode structure is used to handle voltages that are higher than the allowed operating voltage of a device, e.g. a transistor, that are provided by supply voltage terminals 302, 304. In the cascode 318, a second transistor (source) is connected to the drain of a first transistor to reduce the overall voltage like a series resistance. Thus, the cascode circuit can operate higher voltages that the single transistors allow.

As in all other types of cascoded circuits, the circuit area size increases significantly. That is, larger silicon area consumption is required as the number of required transistors increases and the transistors width needs to be increased. In particular, the transistor layout of HV transistors is significantly larger than of low voltage (LV) transistors. Further, the manufacturing effort is increasing with increasing high voltage capabilities of the HV devices. For that reason, it would be preferred to implement the cheapest possible HV device to reduce process cost.

SUMMARY OF THE INVENTION

The invention provides a level shifter to shift a voltage and a method to operate such a level shifter. That is, to transfer a lower voltage signal into a high voltage signal. Thus, the usage of a cascode structure may be avoided. Alternatively or in addition, the output voltage may be higher than the allowed operating voltage of the used devices of the level shifter. Further, the level shifter may have an area consumption that is smaller than the area required for a cascode level shifter.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
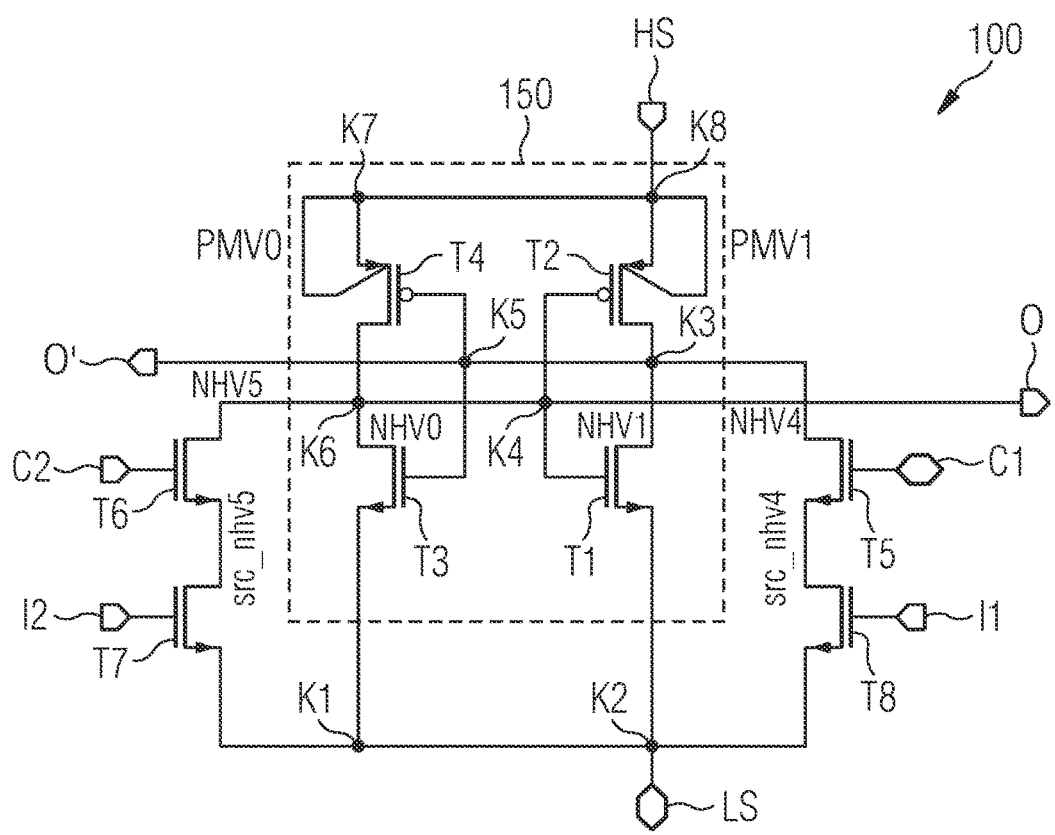
FIG. 1 shows a circuit diagram of a level shifter according to various embodiments.

FIG. 1 illustrates a circuit diagram of a level shifter 100 according to various embodiments. In various embodiments, the level shifter includes a latch 150 wherein the low supply voltage (provided at a low supply voltage terminal LS) and the high supply voltage (provided at a high supply voltage terminal HS) of the latch 150 may be changed. The latch 150 includes a plurality of transistors T1, T2, T3, T4 and is configured to store a content that is set by an input I1, I2, e.g. a set input I1 and a reset input I2. The content may be a voltage or voltage level that is correlated to a logic state, e.g. "1" or "0". The content may be stored in a node K4, K6 or K3, K5 that is connected to an output O, O' of the level shifter 100, respectively.

The content of the latch 150, e.g. a logic "1" or a logic "0", may be set at a low supply voltage level via the low supply voltage terminal LS, e.g. from a low voltage input signal, at an input terminal I1. A low supply voltage level may be about 0 V, as an example. The working principle of the level shifter is illustrated in more detail in FIG. 2.

Afterwards the low and/or high supply voltages of the latch 150 may be changed to higher voltages via the respective low and high supply voltage terminal LS, HS.

As a result the voltage level of the output terminal O of the level shifter 100 may be shifted to about the voltage level of the high supply voltage in case the stored content is a logic "1". That is, the voltage level may be about the voltage level provided at the low supply voltage terminal in case the stored content is a logic "0". However, the latch 150 keeps the content, that is the logic state at the output terminal O, if the input terminal(s) I1, I2 is/are isolated after setting the latch 150. The isolation of the input terminal may be accomplished due to biasing the transistors T1, T2, T3, T4 of the latch 150 by a voltage, e.g. a medium voltage, at a bias terminal C1, C2 connected to and/or controlling the voltage level at the gate or base terminals of the respective terminals T1, T2, T3, T4.

The voltage at the input terminal(s) I1, I2 may be a low voltage, that is in a range of about 0 V to 5 V. The voltage at the bias terminal(s) C1, C2 may be a medium voltage, that has a larger voltage level than the low voltage. The voltage at the transistor T1, T2, T3, T4 of the latch 150 may be a high voltage, that has a larger voltage level than the medium voltage.

The maximum bias across the transistors T1, T2, T3, T4 of the latch 150 may not be increased during the operation of the level shifter 100, e.g. in case the low and high supply voltages are shifted to higher voltages in parallel. That is, the transistors T1, T2, T3, T4 of the latch 150 will only see the voltage difference between the high and low supply voltages and will not see the total high output voltage of the high supply voltage with regard to 0 V.

In detail, in various embodiments the level shifter 100 may include a low supply voltage terminal LS and a high supply voltage terminal HS. The low supply voltage terminal LS may be connected to a second node K2 and the high supply voltage terminal HS may be connected to an eighth node K8.

The level shifter 100 may further include the latch circuit 150, one or more input terminals I1, I2, C1, C2 and one or more output terminals O, O' that are described in more detail below.

The latch 150 may be realized by high voltage (HV) devices, HV transistors T1, T2, T3, T4 in various embodiments. The transistors T7, T8 directly connected to the input terminals I1, I2 may be low voltage (LV) devices.

The latch 150 of the level shifter 100 may include a first path and a second path. The second path may have a competing voltage level regarding the voltage level of the first path.

The first path may include or may be connected to a first input terminal I1 and a first cascode bias terminal C1. The first input terminal I1 may be connected to a transistor T8 and the first cascode bias terminal C1 may be connected to a transistor T5.

The transistor T8 connected to the first input terminal I1 may be a low voltage transistor. The transistor T8 may have a first terminal that is an emitter terminal or a source terminal that is connected to a second node K2. The transistor T8 may have a second terminal that is a gate terminal or a base terminal that is connected to the input terminal I1. The transistor T8 may have a third terminal that is a collector terminal or a drain terminal that is connected to a terminal of the transistor T5 that is connected to the cascode bias terminal C1.

The transistor T5 connected to the first cascode bias terminal C1 may be a high voltage transistor. The transistor T5 may have a first terminal that is an emitter terminal or a source terminal that is connected to a terminal of the transistor T8 connected to the input terminal I1, e.g. that is connected to the collector terminal or a drain terminal of the transistor T8. The transistor T5 may have a second terminal that is a gate terminal or a base terminal that is connected to the cascode bias terminal C1. The transistor T5 may have a third terminal that is a collector terminal or a drain terminal that is connected to a third node K3 and/or a fifth node K5.

The second path may include or may be connected to a second input terminal I2 and a second cascode bias terminal C2. The second input terminal I2 may be connected to a transistor T7 and the second cascode bias terminal C2 may be connected to a transistor T6.

The transistor T7 connected to the second input terminal I2 may be a low voltage transistor. The transistor T7 may have a first terminal that is an emitter terminal or a source terminal that is connected to a first node K1. The transistor T7 may have a second terminal that is a gate terminal or a base terminal that is connected to the input terminal I2. The transistor T7 may have a third terminal that is a collector terminal or a drain terminal that is connected to a terminal of the transistor T6 that is connected to the cascode bias terminal C2.

The transistor T6 connected to the second cascode bias terminal C2 may be a high voltage transistor. The transistor T6 may have a first terminal that is an emitter terminal or a source terminal that is connected to a terminal of the transistor T7 connected to the input terminal I2, e.g. that is connected to the collector terminal or a drain terminal of the transistor T7. The transistor T6 may have a second terminal that is a gate terminal or a base terminal that is connected to the cascode bias terminal C2. The transistor T6 may have a third terminal that is a collector terminal or a drain terminal that is connected to a sixth node K6 and/or a fourth node K4.

The second input terminal I2 may be inverted to the first input terminal I1 that is the voltage level correlated to a logic state is inverted.

The first node K1 may be connected to the second node K2. The sixth node K6 may be connected to the fourth node K4. A seventh node K7 may be connected to the eight node K8. A fifth node K5 may be connected to the third node K3. In FIG. 1, nodes K1, K2, K3, K4, K5, K6, K7, K8 are illustrated as separated nodes to allow a clear presentation of the underlying principle of the logic device. At least some of the nodes may have the same electrical potential, in fact. Therefore, nodes with the same electrical potential may be considered as a single nodes. In particular, node K1 may be equal to node K2, node K3 may be equal to node K5, node K4 may be equal to node K6 and node K7 may be equal to node K8.

A first output terminal O may be connected to the fourth node K4 and the second output terminal O' may be connected to the fifth node K5. The second output terminal O' may have a voltage level corresponding to a logic state that is competing to an inverted logic state corresponding to a voltage level at the first output terminal O.

In addition, the first path may include a first transistor T1 and a second transistor T2. The first and second transistors T1, T2 may be high voltage transistors. In various embodiments, the first transistor T1 may be a n-type transistor (npn) and the second transistor T2 may be a p-type transistor (pnp).

The transistor T1 may have a first terminal that is an emitter terminal or a source terminal that is connected to the node K2. The transistor T1 may have a second terminal that is a gate terminal or a base terminal that is connected to the node K4. The transistor T1 may have a third terminal that is a collector terminal or a drain terminal that is connected to the node K3.

The transistor T2 may have a first terminal that is an emitter terminal or a source terminal that is connected to the node K8. The transistor T2 may have a second terminal that is a gate terminal or a base terminal that is connected to the node K4. The transistor T2 may have a third terminal that is a collector terminal or a drain terminal that is connected to the node K3.

The second path may include a third transistor T3 and a forth transistor T4. The third and fourth transistors T3, T4 may be high voltage transistors. In various embodiments, the third transistor T3 may be a n-type transistor (npn) and the fourth transistor T4 may be a p-type transistor (pnp).

The transistor T3 may have a first terminal that is an emitter terminal or a source terminal that is connected to the node K1. The transistor T1 may have a second terminal that is a gate terminal or a base terminal that is connected to the node K5. The transistor T1 may have a third terminal that is a collector terminal or a drain terminal that is connected to the node K6.

The transistor T4 may have a first terminal that is an emitter terminal or a source terminal that is connected to the node K7. The transistor T4 may have a second terminal that is a gate terminal or a base terminal that is connected to the node K5. The transistor T4 may have a third terminal that is a collector terminal or a drain terminal that is connected to the node K6.

That is, the collector or the drain terminal of the first and second transistors T1, T2 of the first path may be connected to the gate or base terminal of the third and fourth transistors T3, T4 of the second path via the nodes K3, K5. Further, the collector or drain terminal of the third and fourth transistors T3, T4 of the second path may be connected to the gate or base terminal of the first and second transistors T1, T2 of the first path via the nodes K4, K6.

The emitter or source terminals of the first transistor T1 of the first path and of the third transistor T3 of the second path may be connected to the low supply voltage terminal LS via nodes K1 and/or K2.

The emitter or source terminals of the second transistor T2 of the first path and of the fourth transistor T4 of the second path may be connected to the high supply voltage terminal HS via nodes K7 and/or K8.

The collector or drain terminal of transistor T5 connected to the first cascode bias terminal C1 may be connected to the connector or drain terminals of the first and second transistors T1, T2 via node K3.

The collector or drain terminal of transistor T6 connected to the second cascode bias terminal C2 may be connected to the connector or drain terminals of the third and fourth transistors T3, T4 via node K6.

The emitter or source terminals of the transistors T7, T8 connected to the first and second input terminals I1, I2, as described above, may be connected to the emitter or source terminals of the first transistor T1 of the first path and of the third transistor T3 of the second path.

The first output terminal O may be connected to the gate or base terminals of the first and second transistors T1, T2 of the first path and/or the drain or collector terminals of the third and fourth transistors T3, T4 of the second path via nodes K4 and/or K6.

The second output terminal O' may be connected to the gate or base terminals of the third and fourth transistors T3, T4 of the second path and/or the drain or collector terminals of the first and second transistors T1, T2 of the first path via nodes K3 and/or K5.

The voltage at the cascode bias terminal C1, C2 inhibits a propagation of high voltages, e.g. of the low and high supply voltage terminals LS, HS to the low voltage input terminals I1, I2. That is, the LV transistor(s) T7, T8 directly connected to the input terminal(s) I1, I2 is/are protected by HV transistors T5, T6 connected to the cascode bias terminals C1, C2, e.g. respectively. The gates or bases of the HV transistors T1, T2, T3, T4 of the latch 150 may be constantly biased by the high supply voltage of the cascode bias terminal(s) C1, C2, e.g. about 5V in the example shown in the timing diagram 210 in FIG. 2.

Figure 3:
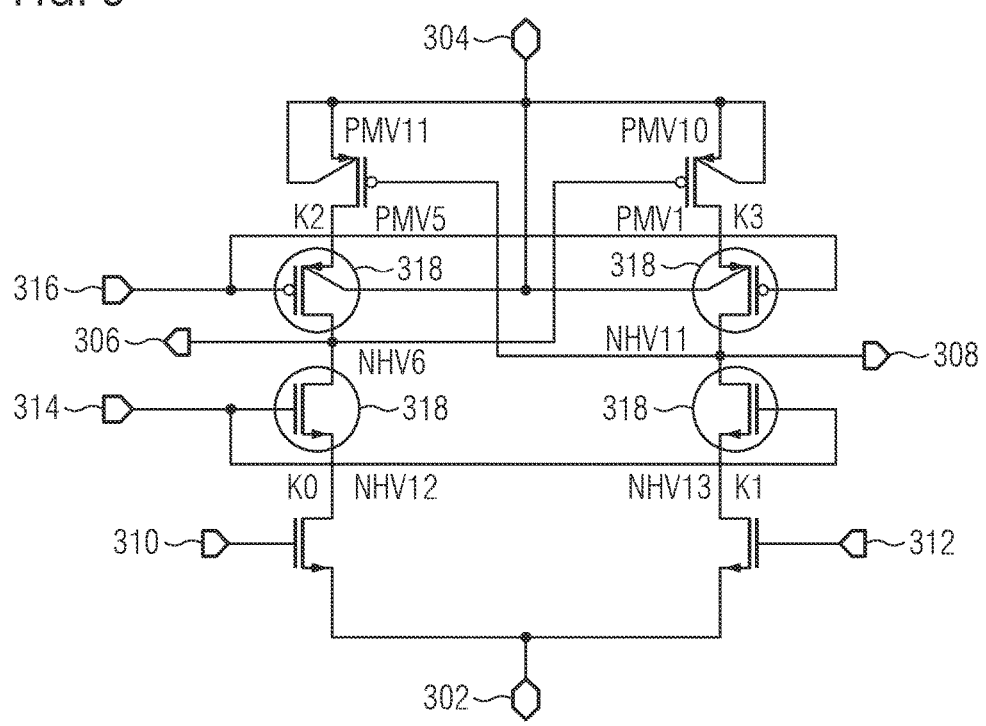
FIG. 3 shows a level shifter according to a known art.

Thus, the level shifter 100 according to various embodiments may include less HV devices, e.g. transistors, than a level shifter known in the arts, e.g. 6 HV transistors instead of 8 HV transistors as used by a cascoded level shifter as shown in FIG. 3. That is, a cascoding of the low supply voltage in the latch is optional, e.g. not needed, by using the 4 HV devices T1, T2, T3, T4.

The level shifter 100 may be used in an embedded flash module and, thus, allows a reduction of the silicon area required for the embedded flash module. The flash module may be a non-volatile flash memory.

Figure 2:
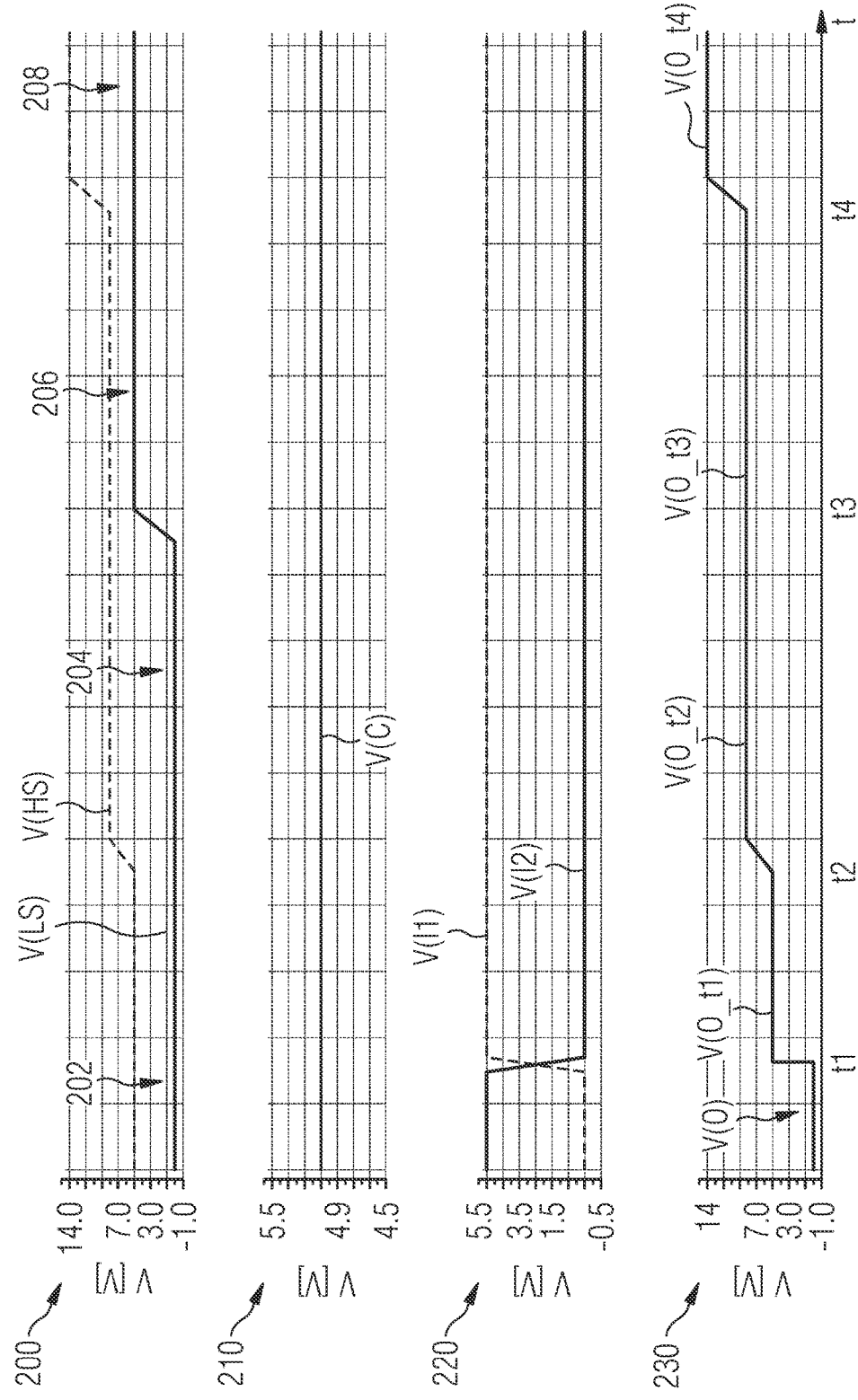
FIG. 2 shows timing diagrams of voltage levels in a level shifter according to various embodiments.

FIG. 2 illustrates timing diagrams of voltage levels in a level shifter according to various embodiments. The timing diagrams illustrated in FIG. 2 are intended to illustrate the underlying working principle of a level shifter described in various embodiments without limitation to the underlying embodiment. The level shifter may be designed according to an above or below described embodiment of a level shifter, e.g. as described in FIG. 1.

In a first timing diagram 200, the voltage level at the low supply voltage terminal V(LS) and the voltage level at the high supply voltage terminal V(HS) are illustrated.

In a second timing diagram 210, the voltage level at the cascode gate bias terminals V(C) is illustrated.

In a third timing diagram 220, the voltage level at the first input terminal V(I1) and the voltage level at the second input terminal V(I2) are illustrated.

In a fourth timing diagram 230, the voltage level at the first output terminal is illustrated.

The voltage level V(C) at the cascode gate bias remains about constant and above 0 V during the timing, e.g. at about 5 V. The voltage level at the second input terminal V(I2) is about inverted to the voltage level at the first input terminal V(I1). The maximum voltage level at the input terminals V(I1), V(I2) may be about 5 V, that is a low voltage value.

The latch is set at t1 to a voltage level V(O_t1), as an example, by increasing the voltage level at the first input terminal V(I1) and decreasing the voltage level at the second input terminal V(I2). That is, the logic state that correlates to the voltage level is stored in the latch 150. Hence, the voltage level at the output terminal V(O) increases to about the voltage level proportional to the voltage at the input terminal V(I1) and/or high supply V(HS).

The voltage level at the low supply voltage terminal V(LS) may be a first value before, during and after the setting of the level shifter at t1. The first value may be e.g. 0V. The voltage level at the high supply voltage terminal V(HS) may be a second value before, during and after the setting of the level shifter at t1. The second value may be a value large enough to distinguish the first value from the second value, e.g. at least 3 V, e.g. about 5 V. That is, the difference 202 between the first and second values may be about 5 V. In general, the difference between the voltage levels of the low and high supply voltages may be less or than or equal to a medium voltage level, e.g. the voltage level at the cascode bias terminal.

At a second time t2, the voltage level at the high supply voltage terminal V(HS) may be increased from the second value to a third value. The third value may be as large such that the transistors of the latch sustain the voltage difference 204 between the high and low supply voltage terminals. That is, the third value may cause a maximum voltage difference, e.g. about 8 V. The increase of the voltage level to the third value at t2 may cause an increase in the voltage level at the first output terminal V(O_t2), e.g. to a value proportional to the voltage level of the third value, e.g. to about 8 V. That is, the voltage at the first output O is shifted to a higher level corresponding to a higher voltage of the stored logic state.

At a third time t3, the voltage level at the low supply voltage terminal V(LS) may be increased from the first value to a fourth value. That is, the voltage level at the low supply voltage terminal is trailed with regard to the voltage level at the high supply voltage terminal. The fourth value may be a value large enough to distinguish the third value from the fourth value, e.g. about 3 V. That is, the difference 206 between the third and fourth values may be about 3 V. The increase of the voltage level to the fourth value at t3 may not cause an increase in the voltage level at the first output terminal V(O_t3). That is, the voltage level of the stored logic state, in the example a logic "1", remains un-amended. However, if the stored logic state would be a logic "0" the voltage level at the output terminal O would increase to about the voltage level of the low supply voltage terminal at t3. The increase to the third value causes the latch to be self-locked. That is, a decrease of the voltage level at the first input terminal may not result in an amendment of the voltage level at the output terminal(s).

At a fourth time t4, the voltage level at the high supply voltage terminal V(HS) may be increased from the third value to a fifth value. The fifth value may be as large such that the transistors of the level shifter sustain the voltage difference 208 between the high and low supply voltage terminals. That is, the fifth value may cause a maximum voltage difference, e.g. about 8 V. Hence, the fifth value may be, e.g. 13 V since the voltage level at the low supply may be the third value, e.g. 5 V. The increase of the voltage level to the fifth value at t4 may cause an increase in the voltage level at the first output terminal V(O_t4), e.g. to a value corresponding to the voltage level of the fifth value, e.g. about 13 V. That is, the voltage at the first output O is shifted to an even higher level. However, the content and more specifically the logic state stored in the latch remain as originally stored.

The voltage level at the output terminal maybe increased further in a similar operation as described to set a predetermined voltage level at the output terminal. The predetermined voltage level may depend on the specific application using the described level shift, e.g. for a non-volatile flash memory. Hence, higher or lower voltage levels may be used, e.g. up to about 20 V or more, e.g. up to 50 to 100 V.

In various embodiments the increase of the voltage levels of the low and high supply voltages at t2, t3 and/or t4 may be at the same time, that is simultaneously, or at different times. In example, the voltage level at the low supply voltage terminal is increased at t3 before the voltage level at the high supply voltage terminal is increased at t4. Alternatively, the voltage level at the low supply voltage terminal may be increased at t3 after the voltage level at the high supply voltage terminal is increased at t4 in case the difference between the voltage levels V(HS)–V(LS) is less than a predetermined value. The predetermined value may be maximum voltage difference that is sustainable by the transistors of the latch.

Starting with t1 until t3, the voltage levels of the cascode bias terminal and input terminals V(C), V(I1) and V(I2) remain about constant or unchanged. The constant voltage level at cascode bias terminal V(C) causes a biasing of the transistors of the latch. Hence, the latch and, thus, the logic stated stored in the latch, are self-locked due to the biasing when the voltage level at the low supply voltage terminal is increased at t3. Starting with t3, the input terminals are isolated from the output terminals. Hence, the voltage levels at the input terminals V(I1) and V(I2) may be amended without affecting the voltage level at the output terminal V(O).

In the example illustrated in FIG. 2, in the fourth time period, beginning at t4 with the increase of the high supply voltage, the low voltage domain (that is the logic "0") is from about 0 V to about 5V and the high voltage domain (that is the logic "1") is from about 5 V to about 13 V. The maximum voltage across the HV transistors of the latch 150 is limited to about 8 V in this example due to parallel increase of the low and high supply voltages. The maximum voltage across the HV transistors may be higher or lower than 8 V depending on the design of the HV transistors used for the latch 150. The parallel increase may be understood as a trailing of the low supply voltage with regard to the high supply voltage. The parallel increase substantially refers to the voltage level. The increase of the voltage levels of the low and high supply voltages may be parallel in time or may be offset.

Thus, the voltage level at the output terminal may be shifted to a higher level than seen by any transistor within the circuit via the parallel increase of the low and high supply voltages.

Further, the latch 150 functionality allows isolating the input of the input terminals I1, I2 after setting the latch 150 state (low/high) at t1 without losing the stored logic state within the latch 150. That is, the latch 150 is self-locking while shifting up the voltage level at the low supply voltage terminal LS and self-unlocking while shifting down the voltage level at the low supply voltage terminal LS.

That is, the latch may be self-unlocked by decreasing the voltage levels at the low and high supply voltage terminals to the first and second values in a voltage level decreasing procedure that is reversed to the above described increase.

Example 1, that is described in the context of FIG. 1 and FIG. 2, is a level shifter 100. The level shifter 100 includes a low supply voltage terminal LS, a high supply voltage terminal HS, at least one input terminal I1, I2, at least one output terminal O, O' and a latch 150. The latch 150 is configured: to store a predetermined logic state by setting a storage node to a (first) voltage level in response to receiving a predetermined voltage level at the at least one input terminal, to amend the voltage level at the storage node in response to receiving an amended voltage/s at the low supply voltage terminal and/or at the high supply voltage terminal, and to output the predetermined logic state having the amended (second) voltage level from the storage node to the at least one output.

The predetermined logic state may be "0" or "1". The storage node for the first input I1 may be a node that is connected to the output O, e.g. node K4, K6. The storage node for the second input I2 may be a node that is connected to the output O', e.g. node K3, K5. The predetermined voltage level at the at least one input terminal may be, as an example, about 0 V (logic "0") or about 5 V (logic "1") or similar. Thus, the (first) voltage level at the storage node may be about 0 V or about 5 V.

The amendment of the voltage level at the storage node may be an increase or a decrease of the voltage level at the storage node. However, the stored logic state remains stored in the storage node. That is, the latch 150 is locked during the amendment. The amendment of the voltage/s at the low supply voltage terminal LS and/or at the high supply voltage terminal HS may be an increase or a decrease of voltage/s respectively. The voltage is amended respectively such that the voltage difference between the voltage level at low supply voltage terminal LS and at the high supply voltage terminal HS is lower than a first predetermined value, e.g. 8V, that is correlated to a maximal voltage that may be sustained by transistors of the latch 150. In addition, the voltage difference may be larger than a second predetermined value that is correlated to securely distinguish a logic "0" state from a logic "1" state by comparing the respective voltage levels, e.g. 3 V.

The output of the predetermined logic state having the amended (second) voltage level from the storage node to the at least one output may be provided by an electrical connection between the storage node and the output terminal.

Thus, a level shifter for shifting a voltage level according to various embodiments is requiring less high voltage devices than a common level shifter. In addition, a cascoding of the low supply voltage in the latch is optional, e.g. not required.

In Example 2, the subject matter of Example 1 may further include that the latch 150 includes a plurality of transistors T1, T2, T3, T4 and the level shifter 100 includes at least one bias terminal C1, C2. The bias terminal C1, C2 is configured to bias the transistors T1, T2, T3, T4 in response to receiving a voltage at the at least one bias terminal C1, C2. This way, the voltage level of the output terminal O of the level shifter 100 may be shifted to about the voltage level of the high supply voltage and the latch 150 keeps the content, that is the logic state at the output terminal O.

In Example 3, the subject matter of Examples 1 or 2 may further include that the level shifter 100 includes a first output terminal O' coupled to the storage node K3, K5/K4, K6 and a second output terminal O' coupled to another storage node K3, K5/K4, K6, wherein the latch 150 is configured such that the voltage level at the first output terminal O corresponds to a first logic state and the voltage level at the second output terminal O' corresponds to a second logic state, wherein the second logic state is an inverted logic state regarding the first logic state.

In Example 4, the subject matter of Examples 1 to 3 may further include that the level shifter 100 includes a bias terminal C1, C2 connected to the latch 150 such that at least a part of the latch 150 is bias-able by a voltage applied to the bias terminal C1, C2. The parts of the latch 150 that are biased by a voltage at the bias terminals C1, C2 may include the gate/base terminals and/or drain/collector terminals of the transistors of the latch, e.g. of competing paths, e.g. via one or more nodes. This allows a self-locking and self-unlocking of the latch.

In Example 5, the subject matter of Example 3 may further include that the level shifter 100 includes a first bias terminal C1 directly coupled to the second output terminal O' and a second bias terminal C2 directly coupled to the first output terminal O.

In Example 6, the subject matter of Example 5 may further include that the level shifter 100 includes a first input terminal I1 and a second input terminal I2, wherein the first input terminal I1 is coupled to the first bias terminal C1 and the second input terminal I2 is coupled to the second bias terminal C2.

In Example 7, the subject matter of Example 5 may further include that the level shifter 100 includes a first input terminal I1 and a second input terminal I2, wherein the first input terminal I1 is coupled to the first bias terminal C1 via a low voltage device T8 and the second input terminal I2 is coupled to the second bias terminal C2 via another low voltage device T7. A low voltage device may be a transistor having a maximum output voltage of about 5 V.

In Example 8, the subject matter of Examples 1 to 7 may further include that the level shifter 100 includes a low voltage transistor T7, T8 that is directly connected to the at least one input terminal I1, I2.

In Example 9, the subject matter of Examples 4 to 8 may further include that at least one bias terminal C1, C2 is a cascode bias terminal C1, C2.

In Example 10, the subject matter of Examples 4 to 9 may further include that the at least one bias terminal C1, C2 is directly connected to the gate or base terminals of the transistors T1, T2, T3, T4 of the latch 150.

In Example 11, the subject matter of Examples 4 to 10 may further include that the latch 150 includes a plurality of high voltage transistors. A high voltage device may be a transistor having a maximum output voltage larger than about 5 V.

In Example 12, the subject matter of Examples 1 to 11 may further include that the latch 150 includes a first path and a second path that is competing to the first path with regard to the stored logic state.

In Example 13, the subject matter of Example 12 may further include that the level shifter 100 includes at least one bias terminal C1, C2, wherein the gate or base terminals of the transistors T1, T2, T3, T4 of the first and second paths are connected to the at least one bias terminal C1, C2.

In Example 14, the subject matter of Examples 12 or 13 may further include that the first and second paths include a p-type transistor and a n-type transistor respectively.

Example 15, that is described in the context of FIG. 1 and FIG. 2, is a method for operating a level shifter 100. The level shifter 100 may be designed according to an above described example or embodiment. The method includes: setting the latch 150 by inputting a logic state into the latch 150, increasing the voltage level of the voltage at the low supply voltage terminal LS from a first voltage level to a second voltage level that is different from the first level, increasing the voltage level of the voltage at the high supply voltage terminal HS from a third voltage level to a fourth voltage level that is different from the third level, and outputting the content in the latch 150 having the fourth voltage level; receiving a voltage having a predetermined voltage level at the at least one input terminal I1, I2, setting a voltage level at the storage node K3, K5/K4, K6 in response to the received predetermined voltage level, receiving voltage/s at the low supply voltage terminal LS and/or at the high supply voltage terminal HS having amended voltage level/s, amending the voltage level at the storage node K3, K5/K4, K6 in response to the received amended voltage level/s, and outputting the voltage having the amended voltage level from the storage node K3, K5/K4, K6 to the at least one output. The amendment of the voltage refers to an increase or a decrease of the respective voltage level.

In Example 16, the subject matter of Example 15 may further include amending the voltage level of the voltage at the high supply voltage terminal HS before the voltage level of the voltage at the low supply voltage terminal LS is amended.

In Example 17, the subject matter of Examples 15 or 16 may further include a plurality of amendments of the voltage level/s at the low and/or high supply terminal until the voltage having the amended voltage level is output.

In Example 18, the subject matter of Examples 15 to 17 may further include that the latch 150 includes a plurality of transistors and that the level shifter 100 includes at least one bias terminal C1, C2, wherein the at least one bias terminal C1, C2 is directly connected to the gates of the transistors T1, T2, T3, T4 of the latch 150. The method further includes a setting of the voltage level at the bias terminal C1, C2 to bias the transistors T1, T2, T3, T4 of the latch 150.

In Example 19, the subject matter of Examples 15 to 18 may further include that the latch 150 is configured such that the voltage level at the bias terminal C1, C2 is constantly above about 0 V at least after setting the voltage level until the outputting. The method further includes providing a voltage at the bias terminal C1, C2 having a voltage level that is above about 0 V In Example 20, the subject matter of Examples 15 to 19 may further include that the latch 150 is configured such that the gate or base terminals of the transistors T1, T2, T3, T4 of the latch 150 are biased at least after setting the voltage level until the outputting. The method further includes biasing the gate or base terminals of the transistors at least after setting the voltage level until the outputting.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

In particular, the devices, e.g. transistors, of the level shifter according to various embodiments are not limited to a specific design but may be selected depending on the intended application of the level shifter and the available voltage levels therein.

What is claimed is:

1. A level shifter, comprising:
   a low supply voltage terminal;
   a high supply voltage terminal;
   at least one input terminal;
   at least one output terminal; and
   a latch configured to:
      store a predetermined logic state by setting a voltage at a storage node to a voltage level in response to a predetermined voltage level of a voltage at the at least one input terminal,
      amend the voltage at the storage node in a plurality of stages from the voltage level to reach an amended voltage level at the storage node, in response to amendments to a voltage level of a voltage at the low supply voltage terminal and a voltage level of a voltage at the high supply voltage terminal, and
      output the predetermined logic state having the amended voltage level from the storage node to the at least one output terminal,
   wherein each of the plurality of stages includes a respective voltage at the storage node that is between the voltage level and the amended voltage level.

2. The level shifter of claim 1, further comprising:
   a low voltage transistor that is coupled to the at least one input terminal.

3. The level shifter of claim 1,
   wherein the latch comprises a plurality of high voltage transistors.

4. The level shifter of claim 1,
   wherein the at least one output terminal comprises:
      a first output terminal coupled to the storage node; and
      a second output terminal coupled to another storage node,
   wherein the latch is configured such that a voltage level of a voltage at the first output terminal corresponds to a first logic state and a voltage level of a voltage at the second output terminal corresponds to a second logic state, and
   wherein the second logic state is an inverted logic state of the first logic state.

5. The level shifter of claim 4, further comprising:
   a first bias terminal coupled to the second output terminal; and
   a second bias terminal coupled to the first output terminal.

6. The level shifter of claim 5,
   wherein the at least one input terminal comprises:
      a first input terminal coupled to the first bias terminal; and
      a second input terminal coupled to the second bias terminal.

7. The level shifter of claim 5,
   wherein the at least one input terminal comprises:
      a first input terminal coupled to the first bias terminal via a low voltage device; and
      a second input terminal coupled to the second bias terminal via another low voltage device.

8. The level shifter of claim 1, further comprising:
   at least one bias terminal,
   wherein the latch comprises a plurality of transistors, and
   wherein the at least one bias terminal is configured to bias the transistors in response to a voltage at the at least one bias terminal.

9. The level shifter of claim 8,
   wherein the at least one bias terminal comprises a bias terminal connected to the latch, and
   the bias terminal is configured to bias at least a part of the latch based on a voltage applied to the bias terminal.

10. The level shifter of claim 8,
    wherein the at least one bias terminal comprises a cascode bias terminal.

11. The level shifter of claim 8,
    wherein the at least one bias terminal comprises a bias terminal that is coupled to a gate terminal or a base terminal of one of the transistors of the latch.

12. The level shifter of claim 8,
    wherein the latch comprises a first path and a second path, and
    the second path is competing to the first path with regard to the stored logic state.

13. The level shifter of claim 12,
    wherein the at least one bias terminal comprises a first bias terminal that is coupled to a gate terminal or a base terminal of one of the transistors of the first path, and
    the at least one bias terminal further comprises a second bias terminal that is coupled to a gate terminal or a base terminal of another one of the transistors of the second path.

14. The level shifter of claim 12,
    wherein each of the first and second paths comprise a p-type transistor and an n-type transistor.

15. A method for operating a level shifter that includes a low supply voltage terminal, a high supply voltage terminal, at least one input terminal, at least one output terminal and a latch, the method comprising:
    storing, by the latch, a predetermined logic state by setting a voltage at a storage node of the level shifter to a voltage level, based on a predetermined voltage level of a voltage at the at least one input terminal;
    amending a voltage level of a voltage at the low supply voltage terminal;
    amending a voltage level of a voltage at the high supply voltage terminal;
    amending, by the latch, the voltage at the storage node in a plurality of stages from the voltage level to reach an amended voltage level at the storage node, based on the amendments to the voltage level of the voltage at the low supply voltage terminal and the voltage level of the voltage at the high supply voltage terminal; and
    outputting, by the latch, the predetermined logic state having the amended voltage level from the storage node to the at least one output terminal,
    wherein each of the plurality of stages includes a respective voltage at the storage node that is between the voltage level and the amended voltage level.

16. The method of claim 15,
wherein said amending a voltage level of a voltage at the high supply voltage terminal comprises:
  amending the voltage level of the voltage at the high supply voltage terminal before the voltage level of the voltage at the low supply voltage terminal is amended.

17. The method of claim 15, further comprising:
setting a voltage of at least one bias terminal of the level shifter to a voltage level to bias transistors of the latch.

18. The method of claim 17, further comprising:
providing a voltage at a bias terminal of the at least one bias terminal at a voltage level that is constantly above 0 V at least from said setting a voltage of at least one bias terminal and until said outputting, by the latch, the predetermined logic state having the amended voltage level.

19. The method of claim 17, further comprising:
biasing gate terminals or base terminals of the transistors such that the gate terminals or the base terminals of the transistors are biased at least from said setting a voltage of at least one bias terminal and until said outputting, by the latch, the predetermined logic state having the amended voltage level.

20. The method of claim 15,
wherein said amending a voltage level of a voltage at the low supply voltage terminal comprises:
  increasing the voltage level of the voltage at the low supply voltage terminal from a first voltage level to a second voltage level that is different from the first voltage level,
wherein said amending a voltage level of a voltage at the high supply voltage terminal comprises:
  increasing the voltage level of the voltage at the high supply voltage terminal from a third voltage level to a fourth voltage level that is different from the third voltage level, and
wherein the amended voltage level of the voltage at the storage node is the fourth voltage level.

* * * * *